United States Patent [19]

Hutson

[11] 4,021,837
[45] May 3, 1977

[54] SYMMETRICAL SEMICONDUCTOR SWITCH HAVING CARRIER LIFETIME DEGRADING STRUCTURE

[76] Inventor: Jearld L. Hutson, P.O. Box 34235, Dallas, Tex. 75234

[22] Filed: Apr. 21, 1975

[21] Appl. No.: 569,695

[52] U.S. Cl. .................................. 357/39; 357/55; 357/64
[51] Int. Cl.² ..................................... H01L 29/747
[58] Field of Search ............... 357/37, 38, 39, 64, 357/57, 55

[56] References Cited

UNITED STATES PATENTS

| | | | |
|---|---|---|---|
| 3,123,750 | 3/1964 | Hutson et al. | 357/39 |
| 3,165,710 | 1/1965 | Strull | 357/57 |
| 3,280,386 | 10/1966 | Philips | 357/39 |
| 3,317,746 | 5/1967 | Hutson | 357/39 |
| 3,524,114 | 8/1970 | Hutson | 357/39 |
| 3,549,961 | 12/1970 | Gault | 357/39 |

FOREIGN PATENTS OR APPLICATIONS

| | | | |
|---|---|---|---|
| 2,128,304 | 12/1971 | Germany | 357/39 |
| 44-25292 | 10/1969 | Japan | 357/64 |

OTHER PUBLICATIONS

I. Grekhov et al., "Thyristors With More Than One Collector," Physics of P-N Jcns. and Semiconductor Devices, (2nd Ed.), London, 1971, pp. 224–227.

Primary Examiner—Michael J. Lynch
Assistant Examiner—Joseph E. Clawson, Jr.
Attorney, Agent, or Firm—Richards, Harris & Medlock

[57] ABSTRACT

The specification discloses a symmetrical semiconductor switch having a semiconductor body formed from a plurality of layers of alternating conductivity types to form a plurality of P-N junctions. Regions of one conductivity type are formed in the outer layers of the opposite conductivity type. Three electrodes contact the outer layers and the regions of the body to form a symmetrical semiconductor switch. Structure is provided on the outer layers of the body in order to degrade the lifetime of carriers which tend to move laterally across the switch in order to improve the switching time of the switch. In one embodiment, the structure comprises grooves formed in the outer layers of the body, the grooves being of sufficient width in order to substantially degrade the lifetime of carriers attempting to pass through layers adjacent the grooves. In another embodiment of the invention, carrier lifetime degrading material such as gold-doped glass is introduced into the body.

7 Claims, 4 Drawing Figures and

SYMMETRICAL SEMICONDUCTOR SWITCH HAVING CARRIER LIFETIME DEGRADING STRUCTURE

THE PRIOR ART

A symmetrical switch for providing bidirectional switching is commonly termed a triac and has heretofore generally comprised five layers of alternating semiconductor types. Four of the layers have been utilized for switching or conducting during one-half cycle of an A.C. voltage source, and three of these same layers and a fifth layer are used for conducting during the alternate half cycle of the voltage source. Descriptions of the construction and operation of such five layer triac devices may be found in U.S. Pat. No. 3,275,909, issued Sept. 27, 1966 to F. W. Gutzwiller and U.S. Pat. No. 3,317,746, issued May 2, 1967 and U.S. Pat. No. 3,475,666, issued Oct. 28, 1969, to the present applicant.

Improved multilayer symmetrical semiconductor switches have been heretofore described in co-pending patent application Ser. No. 488,789, filed July 15, 1974, and entitled "MULTILAYER SEMICONDUCTOR SWITCHING DEVICES". One aspect of these improved switching devices is the reduction of lateral switching currents to provide improved operating characteristics over prior conventional triac devices. However, a need has arisen for improved structure for eliminating such lateral currents to further improve operation of semiconductor switches.

SUMMARY OF THE INVENTION

In accordance with the present invention, structure is provided to substantially reduce lateral current flow across a multilayer semiconductor switching device during switching operation, in order to improve the commutating and static $dv/dt$ characteristics of the device.

In accordance with a more specific aspect of the invention, a semiconductor switch includes a semiconductor body having a plurality of layers of alternating conductivity types. Regions of one conductivity type are formed in at least one outer layer of the opposite conductivity type. Electrodes contact the outer layers and the regions of the body to form a switch. Structure is provided to disgrade the lifetime of carriers tending to move laterally across the switch to improve the switching time of the switch.

In accordance with another aspect of the invention, a semiconductor symmetrical switch includes a semiconductor body having at least three layers of alternating first and second conductivity types. The outer layers of the body are of the first conductivity type. A groove is formed in each of the outer layers to electrically separate each of the outer layers into two areas. First and second regions of the second conductivity type are formed in the two areas of one of the outer layers. A third region of the second conductivity type is formed in one of the areas of the other of the outer layers. First and second electrodes contact the first and second regions and the one of the outer layers. A third electrode contacts the third region and the other of the outer layers.

In accordance with another aspect of the invention, a symmetrical semiconductor switch includes a body formed from at least five layers of alternating first and second types of semiconductor material. The body includes first and second outer layers of the first conductivity material. A pair of regions of the first type of semiconductor material are formed on the first outer layer and are spaced apart by a pair of regions of the second type of semiconductor material. A first groove is disposed between the regions such that regions of the first and second types are on opposite sides of the first groove. A region of the first type of semiconductor material is formed adjacent a region of the second type of semiconductor material on the second outer layer. A second groove is disposed between the regions on the second outer layer. Electrodes contact the regions to form a three terminal switching device. The grooves are of sufficient dimensions to minimize lateral passage of carriers through the central portion of the body. In another embodiment of the invention, gold-doped glass is formed in the grooves to further degrade the lifetime of carriers.

DESCRIPTION OF THE DRAWINGS

For a more complete understanding of the present invention and for further objects and advantages thereof, reference is now made to the following description taken in conjunction with the accompanying drawings, in which.

DESCRIPTION OF THE PREFERRED EMBODIMENT

Figure 1:
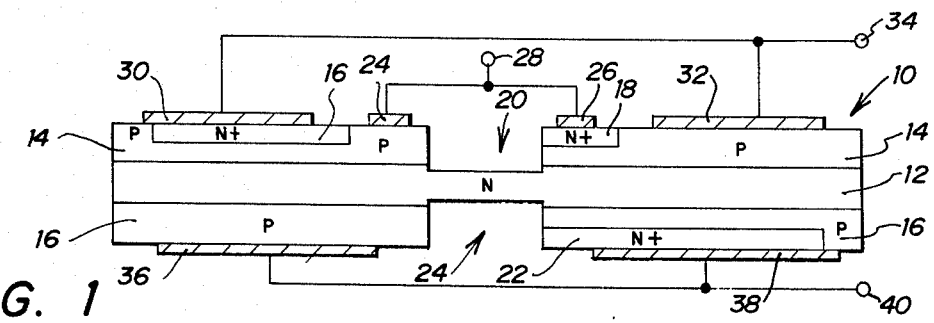
FIG. 1 is a sectional view of a three terminal symmetrical semiconductor switch in accordance with the invention.

Referring to FIG. 1, a semiconductor switch 10 is formed from three layers 12, 14, and 16 of alternating types of semiconductor material. The center layer 12 is formed of N-type conductivity material, while layers 14 and 16 are formed of P-type conductivity material. A pair of regions of N+ type material 16 and 18 are formed in P-type layer 14. A groove 20 extends through layer 14 into N-type layer 12 in order to geometrically and electrically divide layer 14 into two distinct areas.

An N+ region 22 is formed in the other exterior P-type layer 16 to form a five layer switching device. A groove 24 is formed through P-type layer 16 into N-type layer 12 in order to geometrically and electrically divide P-type layer 16 into two areas. Grooves 20 and 24 extend completely across body 10, such that the interior N-type layer 12 is the only layer common to both of the isolated areas of the body.

An electrode 24 contacts one area of the P-type layer 14, while an electrode 26 contacts the N+ region 18. Electrodes 24 and 26 are interconnected to form a gate electrode 28. An electrode 30 contacts the N+ region 16, while an electrode 32 contacts the second area of the P-type layer 14. Electrodes 30 and 32 are interconnected to form a first anode terminal 34. An electrode 36 contacts one area of the P-type layer 16, while an electrode 38 contacts the N+ region 22 and the second area of P-type layer 16. Electrodes 36 and 38 are interconnected to form a second anode electrode 40.

An important aspect of the switch shown in FIG. 1 is that the width of the grooves 20 and 24 is sufficiently wide that electrical carriers are unable to pass through the N-type layer 12 from one area to another between the grooves. While the widths of the grooves will vary in accordance with device size and desired operating characteristics, generally the grooves should be at least as wide as the thickness of the middle N-type layer 12. The carriers are thus able to pass through layer 12 during switching operation, but cannot pass laterally across the gap formed by the grooves. In the preferred embodiment, the grooves 20 and 24 from two-times to ten-times as wide as the middle N-type layer 12. A typical width of grooves 20 and 24 in a typical device would be approximately 10 mils.

The device shown in FIG. 1 provides symmetrical electrical switching operation somewhat similar to that of conventional triacs upon the application of suitable bias to the three electrodes, except that the present device provides substantially improved commutating and static $dv/dt$ characteristics. The $dv/dt$ characteristics of the device may be tailored by increasing the width of the grooves 20 and 24. For example, instead of a $dv/dt$ of five which is found in more conventional switching devices, the present device may be built to provide a $dv/dt$ of several hundred, if desired.

The semiconductor body shown in FIG. 1, and in the remaining figures, may be formed in any suitable manner according to the techniques well known in the art. For example, an N-type electrical conductivity silicon wafer may be diffused on both sides in various steps to form the three layers 12, 14 and 16. The N+ regions 16, 18 and 22 may then be formed on the outer portions of the body by conventional diffusion techniques using suitable dopants or impurities which are compatible with the particular semiconductor material being operated upon.

The particular size and shapes of the diffused regions are, of course, determined by suitable masking and photographic techniques conventionally employed in semiconductor diffusion technology. It will be understood that any suitable semiconductor material may be utilized to form devices according to the invention, but for clarity of illustration, reference is made in the drawings to particular electrical conductivity types and to silicon as the material being utilized. It will be understood that the electrical conductivity types herein specified may be interchanged and reversed.

Figure 2:
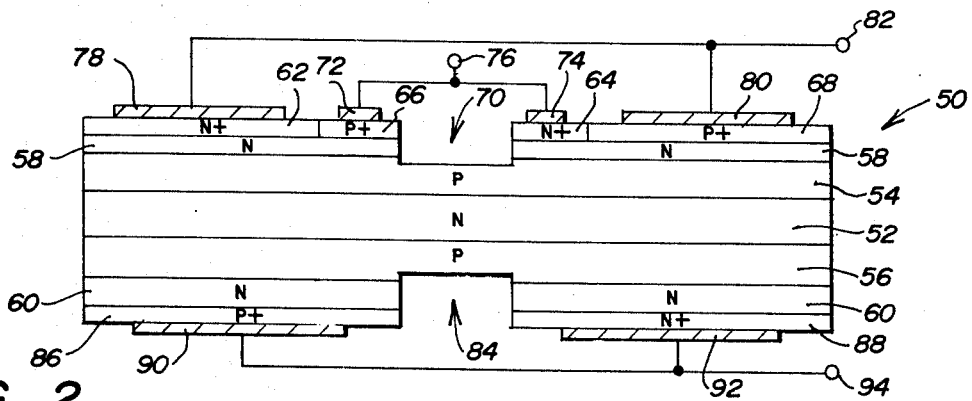
FIG. 2 is a sectional view of another emmbodiment of the symmetrical multilayer semiconductor switch in accordance with the invention.

FIG. 2 illustrates another embodiment of the invention wherein several layers of semiconductor material are utilized rather than the five layers shown in FIG. 1. The switch 50 shown in FIG. 2 includes a central N-type layer 52 having P-type layers 54 and 56 on opposite sides thereof. An N-type layer 58 is disposed adjacent P-type layer 54, while an N-type layer 60 is disposed adjacent P-type layer 56. A pair of N+ regions 62 and 64 are spaced apart over layer 58. P+ regions 66 and 68 are spaced between regions 62 and 64. A groove 70 is disposed through the N-type layer 58 into P-type layer 54. Grooves 70 divide the surface of the switch 50 into two areas, with the regions 62 and 66 being on one side of the groove 70 and the regions 64 and 68 being on the opposite side of the groove. An electrode 72 contacts P+ regions 66, while an electrode 74 contacts N+ regions 64. Electrodes 72 and 74 are interconnected to form a gate electrode 76. An electrode 78 contacts the N+ region 62 and electrode 80 contacts the P+ region 68. Electrodes 68 and 80 are interconnected to form a first anode electrode 82.

A groove 84 is formed on the opposite side of the device 50 through N-type layer 60. On one side of the groove 84, a P+ region 86 is formed. On the opposite side of the groove 84, an N+ region 88 is formed. An electrode 90 contacts P+ region 86 and an electrode 92 contacts N+ region 88.

Electrodes 90 and 92 are interconnected to form a second anode terminal 94.

Figure 3:
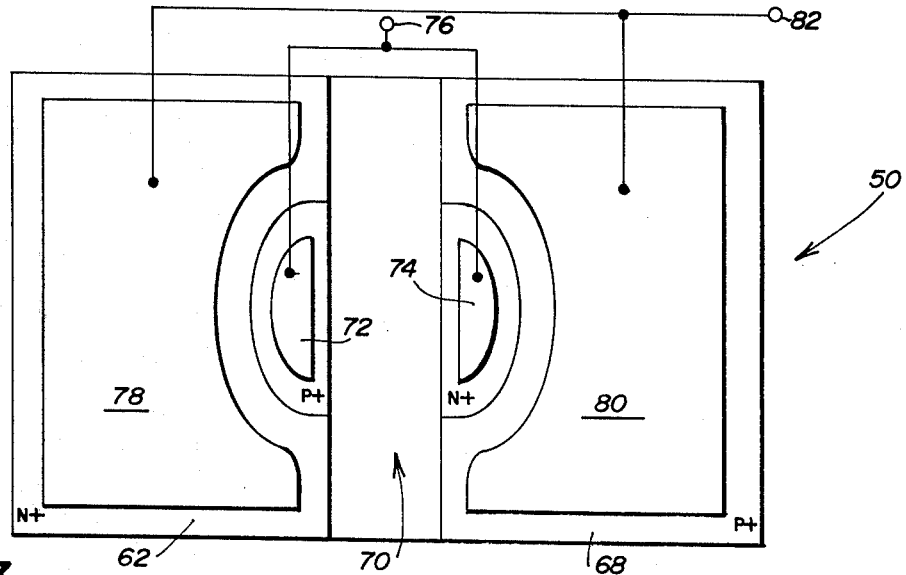
FIG. 3 is a top view of the switch shown in FIG. 2.

FIG. 3 illustrates a top view of the switch 50 and illustrates how the groove 70 extends completely across the body of the switch 50. FIG. 3 also illustrates typical configurations of the electrodes 72, 74, 78 and 80. While the groove 70 is illustrated as being linear, it will be understood that the groove 70 may be provided with various configurations such as disclosed in co-pending patent application Ser. No. 522,603, filed Nov. 11, 1974 by applicant and entitled "FOUR QUADRANT SYMMETRICAL SEMICONDUCTOR SWITCH".

Operation of the switch 50 shown in FIGS. 2 and 3 is generally similar to that described in co-pending patent application Ser. No. 488,789, filed July 15, 1974 and entitled "MULTILAYER SEMICONDUCTOR SWITCHING DEVICES".

An important aspect of the invention is that the grooves 70 and 84 are provided with sufficient widths in order to substantially degrade the lifetime of carriers attempting to pass laterally across the switch 50 through regions 52, 54 and 56. In the manner previously described, grooves 70 and 84 are structured to have sufficient widths to provide the desired static $dv/dt$ by eliminating or reducing the lateral current flow thereacross. The switches shown in FIGS. 1–3 thus provide generally vertical switching currents and essentially eliminate lateral switching currents.

Figure 4:
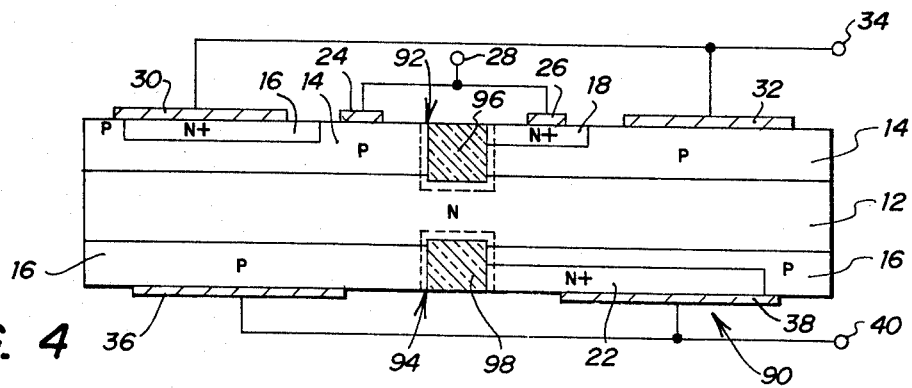
FIG. 4 is a sectional view of yet another embodiment of the invention.

FIG. 4 illustrates the embodiment of the invention which utilizes a material to degrade the lifetime of carriers passing adjacent thereto. Switch 90 shown in FIG. 4 is similar in construction to the switch shown in FIG. 1, and like numerals are utilized for like and corresponding parts therein. However, it will be seen that the grooves 92 and 94 of the switch 90 are of less width than the grooves 20 and 24 previously shown in FIG. 1. Grooves 92 and 94 are filled with carrier lifetime degrading material 96 and 98, respectively. Due to the provision of the material 96 and 98, the width of the grooves 92 and 94 is not required to be as great as that previously described.

The carrier lifetime degrading material 96 and 98 may comprise a variety of different types of material. However, the preferred embodiment for the material 96 and 98 comprises gold-doped glass which fills the grooves 92 and 94 and operates to severely degrade the lifetime of carriers attempting to laterally cross the device through the interior N-type layer 12. With the use of the gold-doped glass 96 and 98, the grooves 92 and 94 need only be from one and one-half to twice the width of the N-type layer 12. A typical range of the widths of the grooves 92 and 94 when the gold-doped glass is utilized is from 3 mils to 15 mils.

As an example of the preparation of a suitable gold-doped glass for use with the invention, a glass is formed by the following components:
  about 40% to 60% lead oxide
  about 30% to 50% silicon dioxide
  about 0% to 20% aluminum oxide
  at least .001% gold oxide The glass is fired at 1250° C. for approximately 24 hours. The glass is then deposited into deionized water in order to crack the glass. The cracked glass is then ground into a fine powder and suspended in deionized water. The suspended glass is applied to slices as a coating and dried. The slice is then fired at 850°–950° C. to form the gold-doped portions 96 and 98.

The gold diffuses slightly into the semiconductor layers of the device shown in FIG. 4. However, the gold is not evenly distributed throughout the silicon, but has the greatest concentration at the P-N junction interfaces. The ability of carriers to move at the junction interfaces is thus substantially reduced, and the lifetime of carriers passing laterally through the N-type layer 12 between the grooves 92 and 94 is substantially reduced.

Although gold-doped glass is preferred, other types of doping such as platinum may be utilized. Also, zinc oxide in combination with boron oxide may be used instead of lead oxide.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A semiconductor switch having symmetrical switching characteristics comprising:
    a semiconductor body having at least three layers of alternating first and second types of semiconductor material to form a plurality of interior P-N junctions, the first and second outer layers of said body being of said first type,
    first and second grooves formed in said first and second outer layers to electrically separate each of said outer layers into two areas, at least one of said interior layers being common to each of said two areas,
    said grooves including glass doped with material selected from a group comprising gold and platinum and operable to substantially eliminate the passage of carriers laterally across said body through said common interior layer from one of said areas to the other,
    a first region of said second type of semiconductor material formed in one of said areas of said first outer layer,
    a second region of said second type of semiconductor material formed in the other of said areas of said first outer layer, said first groove being disposed between said first and second regions,
    a first electrode contacting one of said areas and said first region,
    a second electrode contacting the other of said areas and said second region,
    a third region of said second type of semiconductor material formed in said second outer layer in one of said areas, and
    a third electrode contacting said second outer layer and said third region.

2. The semiconductor switch of claim 1 and comprising five layers of alternating types of semiconductor material.

3. The semiconductor switch of claim 1 wherein said grooves have sufficient width to degrade the lifetime of carriers attempting to pass laterally between said grooves through said common interior layer.

4. A semiconductor switch of claim 3 wherein said grooves are at least as wide as the thickness of said common interior layer.

5. A symmetrical semiconductor switch comprising:
    a body formed from at least five layers of alternating first and second types of semiconductor material, said body having first and second outer layers of said first conductivity material,
    a pair of discrete regions of said first type of semiconductor material formed on said first outer layer,
    a first groove disposed between said discrete regions such that said regions are on opposite sides of said first groove,
    a discrete region of said first type of semiconductor material and a region of said second type of semiconductor material formed on said second outer layer,
    a second groove disposed between said regions on said second outer layer,
    electrodes contacting said discrete regions to form a three terminal switching device,
    said grooves having sufficient width and including glass doped with material selected from a group comprising gold and platinum to prevent lateral passage of carriers through the central portion of said body in order to substantially improve the commutating and static $dv/dt$ characteristics of said switch.

6. The symmetrical semiconductor switch of claim 5 wherein said grooves are sufficiently wide to degrade the lifetime of carriers passing adjacent thereto.

7. The symmetrical semiconductor switch of claim 5 wherein said grooves are at least as wide as the thickness of the interior layers adjacent said grooves.

* * * * *

UNITED STATES PATENT AND TRADEMARK OFFICE
CERTIFICATE OF CORRECTION

PATENT NO. : 4,021,837
DATED : May 3, 1977
INVENTOR(S) : Jearld L. Hutson

It is certified that error appears in the above-identified patent and that said Letters Patent are hereby corrected as shown below:

Col. 1, line 47, change "disgrade" to --degrade--.
Col. 2, line 29, change "emmbodiment" to --embodiment--.
Col. 3, line 12, after "24" insert --are--.

Signed and Sealed this

Fourteenth Day of February 1978

[SEAL]

Attest:

RUTH C. MASON
Attesting Officer

LUTRELLE F. PARKER
Acting Commissioner of Patents and Trademarks